(12) United States Patent
Murakami et al.

(10) Patent No.: US 8,582,259 B2
(45) Date of Patent: Nov. 12, 2013

(54) SEMICONDUCTOR DEVICE AND SWITCHING REGULATOR USING THE DEVICE

(75) Inventors: Kazuhiro Murakami, Kyoto (JP); Mikiya Doi, Kyoto (JP); Yosuke Fukumoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 517 days.

(21) Appl. No.: 12/962,685

(22) Filed: Dec. 8, 2010

(65) Prior Publication Data

US 2011/0133711 A1    Jun. 9, 2011

(30) Foreign Application Priority Data

Dec. 9, 2009   (JP) ................. 2009-279411
Sep. 28, 2010  (JP) ................. 2010-217437

(51) Int. Cl.
*H02H 9/00*    (2006.01)

(52) U.S. Cl.
USPC ............................................. 361/56

(58) Field of Classification Search
USPC ............................................. 361/56
See application file for complete search history.

(56) References Cited

U.S. PATENT DOCUMENTS

| | | | | |
|---|---|---|---|---|
| 6,534,961 | B2 * | 3/2003 | Brandt | 323/282 |
| 6,737,845 | B2 * | 5/2004 | Hwang | 323/284 |
| 6,972,547 | B2 * | 12/2005 | Murakami | 323/267 |
| 7,129,679 | B2 * | 10/2006 | Inaba et al. | 323/222 |

FOREIGN PATENT DOCUMENTS

| | | |
|---|---|---|
| JP | 10-014217 | 1/1998 |
| JP | 2009-108115 | 5/2009 |

* cited by examiner

*Primary Examiner* — Stephen W Jackson
(74) *Attorney, Agent, or Firm* — Fish & Richardson P.C.

(57) ABSTRACT

The semiconductor device according to the present invention has an n-channel output transistor wherein an input voltage is impressed on a drain, and a pulsed switching voltage that corresponds to a switching drive of the transistor is brought out from a source; a bootstrap circuit for generating a boost voltage enhanced by a predetermined electric potential above the switching voltage; an internal circuit for receiving a supply of the boost voltage to generate a switching drive signal, and supplying the signal to a gate of the output transistor; an overvoltage protection circuit for monitoring an electric potential difference between the switching voltage and the boost voltage, and generating an overvoltage detection signal; and a switching element for establishing/blocking electrical conduction between the internal circuit and the end impressed with the boost voltage, in accordance with the overvoltage detection signal.

20 Claims, 13 Drawing Sheets

FIG. 7

|  | PWM | PFM | SIMULTANEOUS PWM/PFM |
|---|---|---|---|
| BEHAVIOR | Vout (Vfb) ∼∼∼∨∼∼∼<br>Vsw ⊓⊔⊓⊔⊓⊔⊓⊔⊓⊓⊓⊓⊔⊓⊔⊓⊔⊓⊔<br>Iout ___/ | Vout (Vfb) ∧∧∧∧∧∧∧∧∧<br>Vsw ⊓⊔⊓⊓⊔⊓⊓⊔⊓⊔⊓⊔⊓⊔<br>Iout ___/ | Vout (Vfb) ∼∼∼∧∧∧∼∼ ---- Vref2<br>                              --∨-- Vref1<br>    PWM  PFM  PWM<br>Vsw ⊓⊔⊓⊔⊓⊔⊓⊓ ⊓⊔⊓⊔⊓⊔⊓⊔<br>Iout ___/ |
| C3 | CERAMIC CAPACITORS (INEXPENSIVE) | OS CAPACITORS (EXPENSIVE) | CERAMIC CAPACITORS (INEXPENSIVE) |
| ADVANTAGES | RIPPLE: LOW<br>C3: INEXPENSIVE<br>FREQUENCY: FIXED (ADVANTAGEOUS FOR EMI) | RESPONSE SPEED: GOOD | RIPPLE: LOW<br>C3: INEXPENSIVE<br>FREQUENCY: FIXED (ADVANTAGEOUS FOR EMI)<br>RESPONSE SPEED: GOOD |
| DISADVANTAGES | RESPONSE SPEED: POOR | RIPPLE: HIGH<br>C3: EXPENSIVE<br>FREQUENCY: LOAD-DEPENDENT (DISADVANTAGEOUS FOR EMI) | — |

SEMICONDUCTOR DEVICE AND SWITCHING REGULATOR USING THE DEVICE

CROSS-REFERENCE TO RELATED APPLICATIONS

This application is based on Japanese Patent Application No. 2009-279411 filed on Dec. 9, 2009, and Japanese Patent Application No. 2010-217437 filed on Sep. 28, 2010, the contents of which are hereby incorporated by reference.

BACKGROUND OF THE INVENTION

1. Field of the Invention

The present invention relates to a semiconductor device for performing the switching drive control of an output transistor, and to a switching regulator using this device.

2. Description of Related Art

FIG. 11 is a circuit block diagram depicting a conventional switching regulator. As shown in FIG. 11, an n-channel MOS (metal oxide semiconductor) field effect transistor 201a is used as the output transistor in the conventional switching regulator, and a gate voltage greater than the input voltage Vin is needed in order to switch on the transistor 201a. In view of this, the conventional switching regulator is provided with a bootstrap circuit (diode 203 and capacitor C2), and a boost voltage Vbst that exceeds the switching voltage Vsw in the switch terminal SW by the charging voltage (voltage obtained by subtracting the forward voltage drop Vf of the diode 203 from a constant voltage Vreg) of the capacitor C2 is supplied to a driver 202a for generating the gate voltage of the transistor 201a.

Japanese Laid-open Patent Publication Nos. 2009-108115 and 10-014217 can be cited as examples of the prior art related to switching regulators.

SUMMARY OF THE INVENTION

FIG. 12 is a waveform diagram depicting an example of a bootstrap operation. In the drawing, the solid line is the switching voltage Vsw, and the broken like is the boost voltage Vbst.

There is no need to design the driver 202a for a high withstand voltage because an electric potential difference equal to or greater than a constant voltage Vreg (e.g., 5 V) is not generated between the bootstrap terminal BST and the switch terminal SW during regular operation.

However, an electric potential difference (e.g., 12 V) corresponding to the input voltage Vin occurs between the bootstrap terminal BST and the switch terminal SW when, for example, a short is formed between the bootstrap terminal BST and the input terminal $V_{IN}$. Therefore, a breakdown may occur in the driver 202a at this time. And even when the breakdown of the driver 202a is avoided at this time, an electric potential difference (e.g., 24 V) corresponding to about twice the input voltage Vin is generated by the bootstrap operation between the bootstrap terminal BST and the switch terminal SW at the time when the transistor 201a is switched on, making it impossible to prevent the driver 202a from breaking down unless the driver 202a is designed for a high withstand voltage. In the worst case, an explosion or fire may occur because it will be impossible to switch the transistor 201a on or off any longer in the regular manner when the driver 202a has broken down.

Designing the driver 202a to withstand high voltage so as to be able to operate even at an electric potential difference corresponding to twice the input voltage Vin results in a driver 202a that occupies a very large area. A problem is therefore encountered in that the switching power supply IC200 becomes larger and more expensive.

In view of the problems encountered by the inventors of the present application, an object of the present invention is to provide a semiconductor device that allows the entire device to be made more resistant to high voltage while suppressing any increases in the size and cost of the device, and to provide a switching regulator using this device.

To achieve the stated object, the semiconductor device according to the present invention is configured to have an n-channel or npn-type output transistor wherein an input voltage is impressed on a drain or a collector, and a pulsed switching voltage that corresponds to a switching drive of the transistor is brought out from a source or an emitter; a bootstrap circuit for generating a boost voltage enhanced by a predetermined electric potential above the switching voltage; an internal circuit for receiving a supply of the boost voltage to generate a switching drive signal, and supplying the signal to a gate or base of the output transistor; an overvoltage protection circuit for monitoring an electric potential difference between the switching voltage and the boost voltage, and generating an overvoltage detection signal; and a switching element for establishing/blocking electrical conduction between the internal circuit and a terminal impressed with the boost voltage, in accordance with the overvoltage detection signal.

With the semiconductor device thus configured, the entire device can be made more resistant to high voltage while being prevented from increasing in size and cost, making it possible to contribute to reducing the size and cost of a switching regulator obtained using this device.

Other features, elements, steps, benefits, and characteristics of the present invention will become more apparent from the subsequent detailed description of the preferred embodiments, and the appended drawings related thereto.

BRIEF DESCRIPTION OF THE DRAWINGS

FIG. 7 is a table illustrating the advantages of the combined use of PWM and PFM;

DETAILED DESCRIPTION OF PREFERRED EMBODIMENTS

Following is a detailed description given with reference to an arrangement in which the present invention is embodied in a step-down switching regulator operating according to a bootstrap method.

(First Embodiment)

Figure 1:
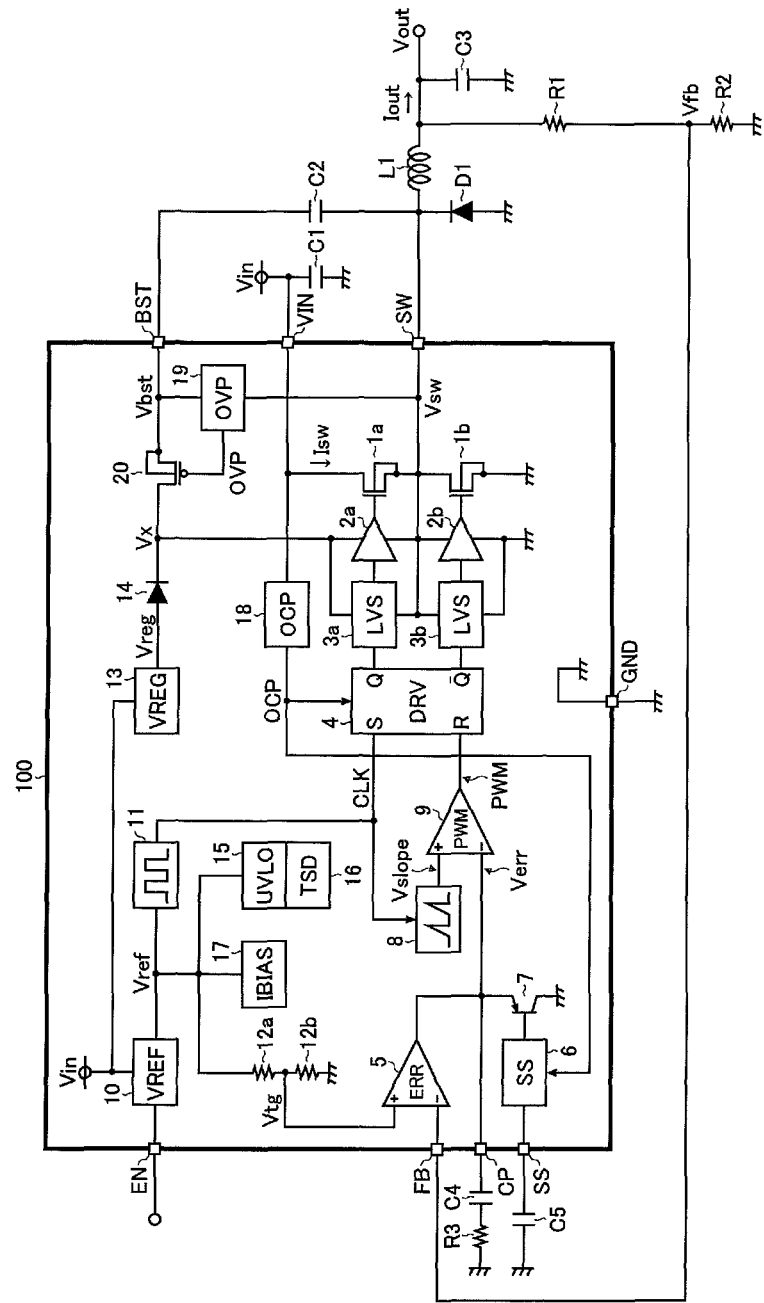
FIG. 1 is a block diagram depicting a first embodiment of the switching regulator.

FIG. 1 is a circuit block diagram depicting a first embodiment of the switching regulator. As illustrated, the switching regulator of the first embodiment is a step-down switching regulator (chopper regulator) having a switching power supply IC 100, as well as an external inductor L1, a diode D1, resistors R1 to R3, and capacitors C1 to C5, and is adapted to generate a desired output voltage Vout from an input voltage Vin.

The switching power supply IC 100 has n-channel MOS field effect transistors 1a and 1b, drivers 2a and 2b, level shifters 3a and 3b, a drive control circuit 4, an error amplifier 5, a soft start control circuit 6, a pnp bipolar transistor 7, a slope voltage generation circuit 8, a PWM (Pulse Width Modulation) comparator 9, a reference voltage generation circuit 10, an oscillator 11, resistors 12a and 12b, a boosting constant voltage generation circuit 13, a diode 14, an undervoltage lockout circuit 15, a thermal shutdown circuit 16, an input bias current generation circuit 17, an overcurrent protection circuit 18, an overvoltage protection circuit 19, and a p-channel MOS field effect transistor 20.

Additionally, as means for electrical connection with the outside, the switching power supply IC 100 has an enable terminal EN, a feedback terminal FB, a phase compensation terminal CP, a soft start terminal SS, a bootstrap terminal BST, an input terminal VIN, a switch terminal SW, and a ground terminal GND.

On the outside of the switching power supply IC 100, the input terminal VIN is connected to the end on which an input voltage Vin (e.g., 12 V) is impressed, and is also connected to the ground end via the capacitor C1. The switch terminal SW is connected to the cathode of the diode D1 and to one end of the inductor L1. The anode of the diode D1 is connected to the ground end. The other end of the inductor L1 is connected to the lead-out end of an output voltage Vout, and to one end of the capacitor C3 and one end of the resistor R1 respectively. The other end of the capacitor C3 is connected to the ground end. The other end of the resistor R1 is connected to the ground end via the resistor R2. The connection node of the resistor R1 and the resistor R2 is connected to the feedback terminal FB as the lead-out end for a feedback voltage Vfb. The capacitor C2 is connected between the switch terminal SW and the bootstrap terminal BST. The enable terminal EN is a terminal on which an enable signal is impressed for the purpose of enabling or disabling driving of the switching power supply IC 100. The phase compensation terminal CP is connected to the ground end via the capacitor C4 and the resistor R3. The soft start terminal SS is connected to the ground end via the capacitor C5.

The inductor L1, the diode D1, and the capacitor C3 mentioned above function as a rectification/smoothing circuit adapted to rectify/smooth a switching voltage Vsw that is drawn from the switch terminal SW, in order to generate the desired output voltage Vout. The aforementioned resistors R1, R2 function as a feedback voltage generation circuit (resistance voltage dividing circuit) for generating feedback voltage Vfb that corresponds to the output voltage Vout. The capacitor C2, together with the diode 14 (described later) built into the switching power supply IC 100, forms a bootstrap circuit.

The internal configuration of the switching power supply IC 100 will be described next.

The transistors 1a, 1b are a pair of switching elements serially connected between the input terminal VIN (the end impressed with the input voltage Vin) and the ground terminal GND. Through the switching driving of these elements in complementary fashion, a pulsed switching voltage Vsw is generated from the input voltage Vin. The transistor 1a is a large-scale output transistor (power transistor) designed to pass a large switching current Isw, while the transistor 1b is a small-scale synchronous rectification transistor designed to let out ringing noise, generated at times of low load (during discontinuous current mode), to the ground terminal GND. To describe more specifically the connective relationship of the two terminals, the drain of the transistor 1a is connected to the input terminal VIN. The source and back gate of the transistor 1a are connected to the switch terminal SW. The drain of the transistor 1b is connected to the switch terminal SW. The source and back gate of the transistor 1b are connected to the ground terminal GND.

The term "complementary" as used herein refers not only to instances in which ON/OFF states of the transistors 1a, 1b are completely reversed, but also includes instances in which a prescribed delay is imparted to the ON/OFF transition timing of the transistors 1a, 1b, with a view to preventing flow-through current.

The drivers 2a, 2b respectively generate gate voltages (switching drive voltages) for the transistors 1a, 1b, on the basis of output signals from the level shifters 3a, 3b. The upper power supply end of the driver 2a is connected to the connection node of the cathode of the diode 14 and to the drain of the transistor 20 (the end impressed with the drive voltage Vx). The lower power supply end of the driver 2a and the upper power supply end of the driver 2b are both connected to the switch terminal SW. The lower power supply end of the driver 2b is connected to the ground terminal GND. The high level of the gate voltage provided to the transistor 1a is equivalent to the drive voltage Vx, and the low level is equivalent to the ground voltage. The high level of the gate voltage provided to the transistor 1b is equivalent to the input voltage Vin, and the low level is equivalent to the ground voltage.

The level shifters 3a, 3b respectively boost the voltage level of a switching control signal which is input from the drive control circuit 4, and present the signal to the drivers 2a, 2b. The upper power supply end of the level shifter 3a is connected to the connection node of the cathode of the diode 14 and the drain of the transistor 20 (the end impressed with the drive voltage Vx). The lower power supply end of the level shifter 3a and the upper power supply end of the level shifter 3b are both connected to the switch terminal SW. The lower power supply end of the level shifter 3b is connected to the ground terminal GND.

The drive control circuit 4 is a logic circuit that generates a switching control signal for the transistors 1a, 1b on the basis of a clock signal CLK and a pulse width modulation signal PWM.

The error amplifier 5 amplifies the differential between the feedback voltage Vfb and a prescribed target voltage Vtg, and generates an error voltage Verr. To describe the connective relationship, the inverting input terminal (−) of the error amplifier 5 is connected to the feedback terminal FB, and the feedback voltage Vfb (which corresponds to the actual value of the output voltage Vout) is impressed thereon. The noninverting input terminal (+) of the error amplifier 5 is connected to the connection node of the resistor 12a and the resistor 12b, and the prescribed target voltage Vtg (which corresponds to a set target value for the output voltage Vout) is impressed thereon.

Figure 2:
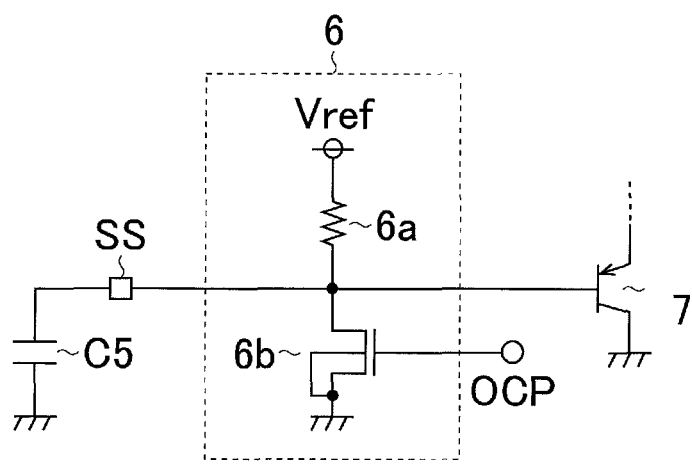
FIG. 2 is a circuit diagram depicting a configurational example of a soft start control circuit 6.

The soft start control circuit 6 has the circuit configuration depicted as an example in FIG. 2, and is adapted to start up the switching regulator, while also initiating charging of the capacitor C5 connected to the soft start terminal SS via the resistor 6a, and controlling the degree of conduction of the transistor 7, whereby the error voltage Verr is clamped to a prescribed soft start voltage Vss (which is equal to the charging voltage of the capacitor C5 plus the base-emitter voltage of the transistor 7). Through soft start control in this manner, the output voltage Vout rises gradually while limiting the charging current supplied to the capacitor C3 at startup, thereby making it possible to proactively prevent overshoot of the output voltage Vout, and inrush current to the load. At the point in time that the error voltage Verr decreases below the soft start voltage Vss, the transistor 7 assumes a nonoperational state, and soft start control is therefore terminated.

On the basis of an instruction from the soft start control circuit 6, the transistor 7 clamps the error voltage Verr to the soft start voltage Vss during startup of the switching regulator. To describe the connective relationship more specifically, the emitter of the transistor 7 is connected to the output end of the error amplifier 5. The collector of the transistor 7 is connected to the ground terminal GND. The base of the transistor 7 is connected to the soft start terminal SS via the soft start control circuit 6.

On the basis of the clock signal CLK generated by the oscillator 11, the slope voltage generation circuit 8 generates a slope voltage Vslope having a triangular waveform, ramp waveform, or sawtooth waveform, and outputs the voltage to the PWM comparator 9.

The PWM comparator 9 compares the error voltage Verr with the slope voltage Vslope in order to generate a pulse width modulation signal PWM for the purpose of determining the switching duty, and outputs this signal to the drive control circuit 4. The upper limit of the switching duty is limited to the maximum duty determined within the circuit, and never reaches 100%. To describe the connective relationship more specifically, the noninverting input terminal (+) of the PWM comparator 9 is connected to the output end of the slope voltage generation circuit 8. The inverting input terminal (−) of the PWM comparator 9 is connected to the output end of the error amplifier 5 and to the phase compensation terminal CP, respectively.

The reference voltage generation circuit 10 generates a reference voltage Vref (e.g., 4.1 V) from the input voltage Vin, and supplies this voltage as internal drive voltage to the elements of the switching power supply IC 100.

Upon receiving the reference voltage Vref, the oscillator 11 generates a clock signal CLK of rectangular waveform having a prescribed frequency, and supplies this signal to the drive control circuit 4 and to the slope voltage generation circuit 8.

The resistors 12a and 12b divide the reference voltage Vref to generate a desired target voltage Vtg, which is then impressed on the noninverting input terminal (+) of the error amplifier 5. To describe the connective relationship more specifically, the resistors 12a and 12b are serially connected between the output end of the reference voltage generation circuit 10 (the end impressed with the reference voltage Vref) and the ground terminal GND, and the mutual connection node thereof is connected to the noninverting input terminal (+) of the error amplifier 5.

The boosting constant voltage generation circuit 13 generates a prescribed constant voltage Vreg (e.g., 5 V) from the input voltage Vin.

The diode 14 is an element connected between the output end of the boosting constant voltage generation circuit 13 (the end for outputting the constant voltage Vreg) and the bootstrap terminal BST. Together with the capacitor C2, the diode forms a bootstrap circuit. A drive voltage Vx for the driver 2a and the level shifter 3a is drawn from the cathode of the diode. In a case in which an overvoltage protection operation, described later, has not been invoked and the transistor 20 is ON, the drive voltage Vx is equal to the boost voltage Vbst appearing on the bootstrap terminal BST (this is a voltage value higher than the switching voltage Vsw by the charging voltage of the capacitor C2 (i.e., a voltage obtained by subtracting the forward voltage drop Vf of the diode 14 from the constant voltage Vreg)). On the other hand, in a case in which an overvoltage protection operation, described later, has been invoked and the transistor 20 is OFF, the drive voltage Vx assumes a voltage value equal to the forward voltage drop Vf of the diode 14 from the constant voltage Vreg. This is described in detail later with reference to the drawings.

The undervoltage lockout circuit 15 operates while receiving a supply of the reference voltage Vref, and functions as malfunction protection means adapted to shut down the switching power supply IC 100 when an abnormal drop in the input voltage Vin has been detected.

The thermal shutdown circuit 16 operates while receiving a supply of the reference voltage Vref, and functions as malfunction protection means adapted to shut down the switching power supply IC 100 when the monitored temperature (the junction temperature of the switching power supply IC 100) reaches a prescribed threshold value (e.g., 175° C.).

The input bias current generation circuit 17 operates while receiving a supply of the reference voltage Vref, and generates an input bias current for the error amplifier 5.

The overcurrent protection circuit 18 operates while receiving a supply of the input voltage Vin, monitors the switching current Isw which flows during the time that the output transistor 1a is ON, and generates an overcurrent detection signal OCP. The overcurrent detection signal OCP is used as a reset signal for the drive control circuit 4 and the soft start control circuit 6. More specifically, in the event it is determined that the switching current Isw is in an overcurrent condition in the overcurrent protection circuit 18, the drive control circuit 4 suspends switching operations of the transistors 1a and 1b, while the soft start control circuit 6 turns the transistor 6b (see FIG. 2) ON and performs discharge of the capacitor C5.

The overvoltage protection circuit 19 monitors an interterminal voltage Vy (equal to Vbst−Vsw, corresponding to the charging voltage of the capacitor C2) being impressed across the bootstrap terminal BST and the switch terminal SW, and generates an overvoltage detection signal OVP. The overvoltage detection signal OVP is used as a gate signal for the transistor 20.

The transistor 20 is a switching element for establishing/blocking electrical conduction between the bootstrap terminal BST and the internal circuitry (the upper power supply end of the driver 2a and the level shifter 3a) in accordance with the overvoltage detection signal OVP. To describe the connective relationship more specifically, the drain of the transistor 20 is connected to the cathode of the diode 14. The source and back gate of the transistor 20 are connected to the bootstrap terminal BST. The gate of the transistor 20 is connected to the output end of the overvoltage protection circuit 19 (the output end of the overvoltage detection signal OVP).

For the transistor 20, it is necessary to use a high-withstand-voltage element (e.g., an element with 30-V withstand voltage) that will not break down when an electric potential difference equivalent to twice the input voltage Vin (e.g., 24 V) arises between the bootstrap terminal BST and the switch terminal SW.

The bootstrap operation of the switching regulator having the above-described configuration will first be described below. When the transistor 1a is switched OFF and the switching voltage Vsw on the switch terminal SW is at a low level (0 V), a current flows from the boosting constant voltage generation circuit 13 along a path via the diode 14 and the capacitor C2. Therefore, the capacitor C2, which is connected between the bootstrap terminal BST and the switch terminal SW, is charged with a charge. At this time, the boost voltage Vbst on the bootstrap terminal BST (i.e., the charging voltage of the capacitor C2) has a value equal to the constant voltage Vref minus the forward voltage drop Vf of the diode 14 (Vreg−Vref).

In a state in which the capacitor C2 is charged with a charge, the transistor 1a is switched ON and the switching voltage Vsw rises from a low level (0 V) to a high level (Vin), whereupon the boost voltage Vbst is boosted to a high value (Vin+(Vreg−Vf)) equal to the high level of the switching voltage Vsw (Vin) plus the charging voltage of the capacitor C2 (Vreg−Vf). Accordingly, by supplying the boost voltage Vbst as the drive voltage Vx for the driver 2a and the level shifter 3a, the ON/OFF driving of the transistor 1a can be performed.

The output feedback operation of the switching regulator having the above-described configuration will be described next.

In the switching power supply IC 100, the error amplifier 5 amplifies the differential between the feedback voltage Vfb and the target voltage VTg to generate an error voltage Verr. The PWM comparator 9 compares the error voltage Verr and the slope voltage Vslope, and generates a pulse width modulation signal PWM. At this time, the logic of the pulse width modulation signal PWM is at a low level when the error voltage Verr is at a higher electric potential than the slope voltage Vslope, and at a high level when the opposite is true. Specifically, where the error voltage Verr is at a high electric potential, the low level interval in a single cycle of the pulse width modulation signal PWM becomes longer, and conversely, where the error voltage Verr is at a low electric potential, the low level interval in a single cycle of the pulse width modulation signal PWM becomes shorter.

On the basis of the clock signal CLK and the pulse width modulation signal PWM, the drive control circuit 4 prevents the transistors 1a and 1b from being switched ON simultaneously, and generates switching control signals for the transistors 1a, 1b so that during the interval that the pulse width modulation signal PWM is at a low level, the transistor 1a is ON and the transistor 1g is OFF. Conversely, during the interval that the pulse width modulation signal PWM is at a high level, the transistor 1a is OFF and the transistor 1g is ON.

Through output feedback control carried out in the above manner, the transistor 1a undergoes switching control so that the feedback voltage Vfb matches the target voltage Vtg. In other words, the output voltage Vout matches the desired target setting.

Moreover, because the transistor 1b undergoes switching control in complementary fashion to that of the transistor 1a, ringing noise can escape to the ground terminal GND through the transistor 1b in the event that the switching current Isw drops at times of low load or no load, resulting in a condition in which the ringing noise arises in the switching voltage Vsw (so-called discontinuous current mode). Specifically, when the transistor 1a is OFF, the switching voltage Vsw is reduced to a low level (0 V) via the transistor 1b, and the capacitor C2 connected between the bootstrap terminal BST and the switch terminal SW can by adequately charged. Therefore, when the transistor 1a subsequently is switched ON, the boost voltage Vbst can be dependably boosted to the desired voltage level (a higher voltage level than the input voltage Vin). Therefore, the transistor 1a can be prevented from malfunctioning (being unable to be switched ON), and a stable step-down operation can be achieved.

The method for phase compensation of the error amplifier 5 will be described next. The response speed and stability of a switching regulator are determined by the frequency Fc at which gain reaches 1. This frequency Fc may be adjusted through the resistance of the resistor R3, which is externally connected to the phase compensation terminal CP (the output end of the error amplifier 5). By increasing the frequency Fc, the response speed of the switching regulator can be increased, but stability (the phase margin) becomes poor, and there is an increased risk of oscillation. Conversely, when the frequency Fc is set too low, a satisfactory response speed may not be attained. Moreover, in order to ensure stability through phase compensation, it is necessary for the phase lag arising from LC resonance in the output stage to be cancelled by a phase lead based on the zero point. The phase lead based on the zero point may be adjusted via the capacitor C4 and the resistor R3 externally connected to the phase compensation terminal CP. At this time, it is preferable for the capacitance of the capacitor C4 to be determined so that the phase lead based on the zero point is about one-third the LC resonance frequency. In a switching regulator, the stability condition for a feedback system involving return of negative feedback is a phase lag of no more than 150° (i.e., a phase margin of at least 30°) when gain is 1 (0 dB).

Figure 3:
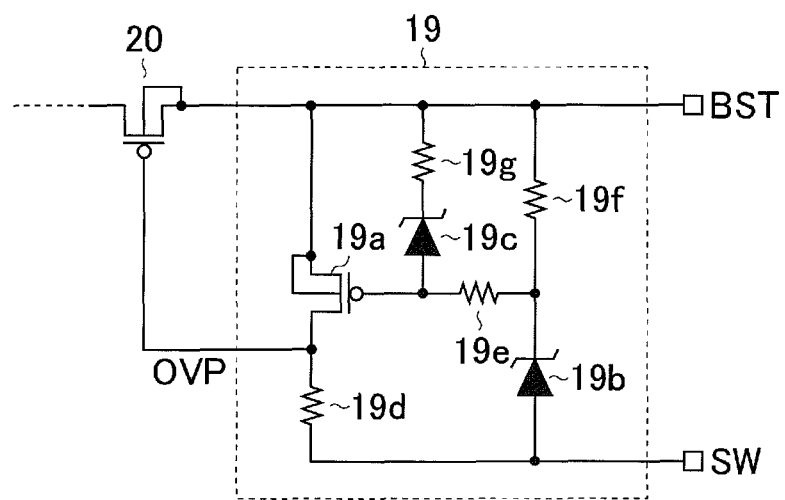
FIG. 3 is a circuit diagram depicting a configurational example of an overvoltage protection circuit 19.
Figure 4:
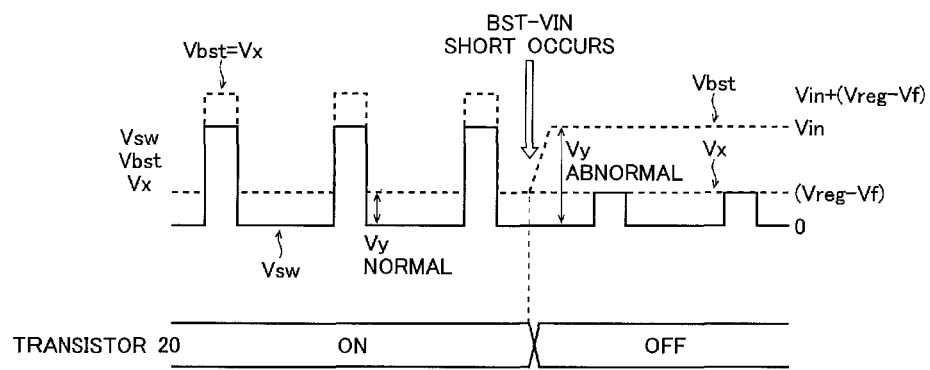
FIG. 4 is a timing chart illustrating the overvoltage protection operation.

Next, the configuration and operation of the overvoltage protection circuit 19 are described in detail with reference to FIGS. 3 and 4. FIG. 3 is a circuit diagram depicting a configurational example of the overvoltage protection circuit 19, and FIG. 4 is a timing chart illustrating the overvoltage protection operation. The upper part of FIG. 4 depicts voltage waveforms for the switching voltage Vsw, the boost voltage Vbst, and the drive voltage Vx, while the lower part of FIG. 4 depicts the ON/OFF status of the transistor 20.

As shown in FIG. 3, the overvoltage protection circuit 19 of the present configurational example has a p-channel MOS field effect transistor 19a, Zener diodes 19b, 19c, and resistors 19d to 19g. The source and back gate of the transistor 19a are connected to the bootstrap terminal BST. The drain of the transistor 19a is connected to the switch terminal SW via the resistor 19d, and is also connected to the gate of the transistor 20 as the output end of the overvoltage detection signal OVP. The gate of the transistor 19a is connected to the anode of the Zener diode 19c, and is also connected to the cathode of the Zener diode 19b via the resistor 19e. The cathode of the Zener diode 19c is connected to the bootstrap terminal BST via the resistor 19g. The cathode of the Zener diode 19b is connected to the bootstrap terminal BST via the resistor 19f. The anode of the Zener diode 19b is connected to the switch terminal SW.

In a case in which the inter-terminal voltage Vy impressed across the bootstrap terminal BST and the switch terminal SW is the normal value (Vreg−Vf, or a value close to that) in the overvoltage protection circuit 19 having the above-described configuration, the gate-to-source voltage of the transistor 19a (the voltage across the ends of the resistor 190 does not rise above the ON threshold voltage of the transistor 19a, and the transistor 19a remains in the OFF state. As a result, the gate of the transistor 20 is connected to the switch terminal SW via the resistor 19d, and a voltage equal to the inter-terminal voltage Vy impressed across the bootstrap terminal BST and the switch terminal SW is impressed across the gate and source of the transistor 20. Accordingly, the transistor 20 is normally in the ON state, and the drive voltage Vx supplied to the upper power supply end of the driver 2a and the level shifter 3a matches the boost voltage Vbst.

On the other hand, in a case in which, for example, a short occurs between the input terminal VIN and the bootstrap terminal BST, and the inter-terminal voltage Vy impressed across the bootstrap terminal BST and the switch terminal SW reaches an overvoltage condition, the gate-to-source voltage of the transistor 19a (the voltage across the ends of the resistor 19f) rises above the ON threshold voltage of the transistor 19a, and the transistor 19a enters the ON state. As a result, the gate of the transistor 20 is connected to the bootstrap terminal BST via the transistor 19a, and the gate and source of the transistor 20 are shorted. Accordingly, the transistor 20 enters the OFF state, and the drive voltage Vx supplied to the upper power supply end of the driver 2a and the level shifter 3a is fixed at a voltage value equal to the constant voltage Vreg minus the forward voltage drop Vf of the diode 14, irrespective of the boost voltage Vbst.

The transistor 20 (high-withstand-voltage switch) used for overvoltage protection is connected on the power supply path from the bootstrap terminal BST to the internal circuitry (driver 2a and shift register 3a), and the transistor 20 is switched OFF when the voltage Vy impressed across the bootstrap terminal BST and the switch terminal SW assumes an overvoltage condition. With such a configuration, there is no need to design the elements of the internal circuitry for a high withstand voltage, making it possible to reduce the surface area needed for the internal circuitry (driver 2a and shift register 3a), and to achieve smaller size and lower cost for the switching power supply IC 100.

Moreover, because an electric potential difference equivalent to twice the input voltage Vin (e.g., 24 V) arises between the gate and source of the transistor 20, it is necessary to employ a high-withstand-voltage element of large element size as the transistor 20, but the internal circuitry (driver 2a and shift register 3a) does not require such high voltage design, thus contributing to shrinking the chip size of the switching power supply IC 100 as a whole.

Also, because the gate-to-source voltage of the transistor 19a is clamped to a prescribed Zener voltage (e.g., 5 V) by the Zener diode 19b, there is no need to use a high-withstand-voltage element for the transistor 19a, and thus even where the overvoltage protection circuit 19 is added, the effect of shrinking the chip size of the switching power supply IC 100 as a whole is not compromised.

(Second Embodiment)

Figure 11:
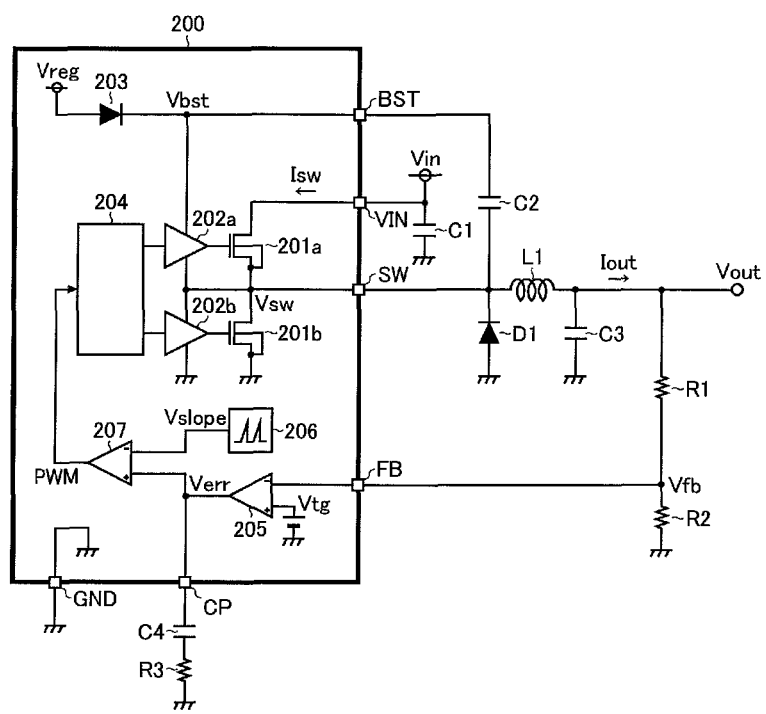
FIG. 11 is a circuit block diagram depicting a conventional example of a switching regulator.
Figure 12:
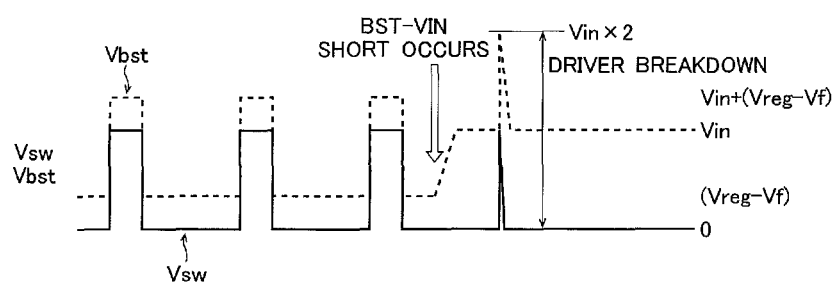
FIG. 12 is a waveform diagram depicting a configurational example of a bootstrap operation.

A conventional switching regulator (a BUCK converter using a bootstrap system) depicted in FIG. 11 has a configuration wherein the transistor 201b connected between the switch terminal SW and the ground terminal GND undergoes switching control in complementary fashion to that of a transistor 201a.

With the conventional configuration shown above, in the event that the switching current Isw drops at times of low load or no load, resulting in a condition in which ringing noise arises in the switching voltage Vsw (so-called discontinuous current mode), the ringing noise may indeed escape to the ground terminal GND through the transistor 201b. Specifically, when the transistor 201a is OFF, the switching voltage Vsw is reduced to a low level (0V) via the transistor 201b, and the capacitor C2 connected between the bootstrap terminal BST and the switch terminal SW can be adequately charges. Therefore, when the transistor 201a subsequently is switched ON, the boost voltage Vbst can be dependably boosted to the desired voltage level (a higher voltage level than the input voltage Vin). Therefore, the transistor 201a can be prevented from malfunctioning (being unable to be switched ON), and a stable step-down operation can be achieved.

However, with the conventional configuration, each time that the transistor 201a is switched OFF, the charge of the switch terminal SW is lost to the ground terminal GND, creating an efficiency problem at times of low load. Also, with the conventional design, appropriate timing control is needed to prevent the transistor 201a and the transistor 201b from being switched ON simultaneously, creating the problem of a complicated circuit design for the drive control circuit 204.

The technical feature of the second embodiment is directed to addressing the above problems, and has as an object thereof to provide a switching regulator with a simple configuration, yet capable of simultaneously improving stability of switching operations at times of low load, and improving the conversion efficiency.

Figure 5:
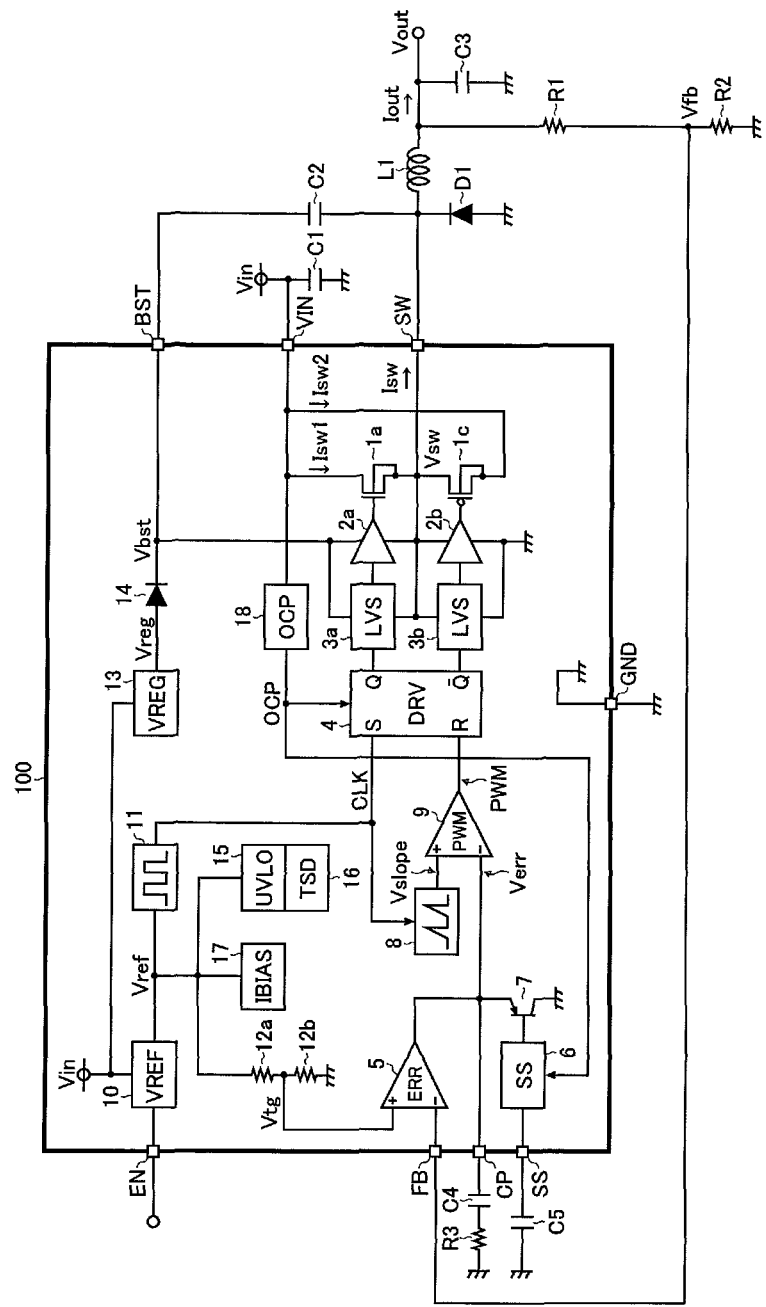
FIG. 5 is a block diagram depicting a second embodiment of the switching regulator.

FIG. 5 is a block diagram depicting a second embodiment of the switching regulator. Elements comparable to those in the first embodiment described previously are assigned the same symbols as in FIG. 1 and are not described where to do so would be redundant, so that the following description may focus on constituent elements unique to the second embodiment.

A feature of the switching regulator of the second embodiment is that the n-channel MOS field effect transistor 1b connected between the switch terminal SW and the ground terminal GND is replaced by a p-channel MOS field effect transistor 1c connected between the switch terminal SW and the input terminal VIN.

In other words, the switching regulator of the second embodiment may be said to have a configuration in which the n-channel MOS field effect transistor 1a and the p-channel MOS field effect transistor 1c are disposed in parallel as output transistors connected between the input terminal VIN and the switch terminal SW.

To describe the connective relationship more specifically, the drain of the transistor 1c is connected to the switch terminal SW. The source and the back gate of the transistor 1c are connected to the input terminal VIN. The gate of the transistor 1c is connected to the output end of the driver 2b.

In the switching regulator having the above-described configuration, the transistor 1c is also ON when the transistor 1a is ON. Conversely, the transistor 1c is OFF when the transistor 1a is OFF. Accordingly, the switching current Isw output to outside the IC from the switch terminal SW is a current equal to the sum of a first switching current Isw1 flowing to the transistor 1a and a second switching current Isw2 flowing to the transistor 1c.

However, because it is sufficient for the transistor 1c to be able to conduct the low second switching current Isw2 at times of low load, the size of the element can be designed to be smaller than the element size of the transistor 1a (for example, about the same as that of the transistor 1b, which was eliminated in the second embodiment). Accordingly, during normal operation (at times of heavy load), the first switching current Isw1 flowing to the transistor 1a dominates over the second switching current Isw2 flowing to the transistor 1c.

By using such a configuration, in the event that the switching current Isw drops at times of low load or no load, resulting in a condition in which ringing noise arises in the switching voltage Vsw (so-called discontinuous current mode) so that the transistor 1a is no longer able to be switched ON, the transistor 1c is nevertheless able to be switched ON without any difficulty, making it possible to output the second switching current Isw and to maintain the output voltage Vout at the desired value.

By eliminating the transistor 1b, the charge of the switch terminal SW is not lost to the ground terminal GND each time that the transistor 1a is switched OFF, making it possible to improve efficiency at times of low load, and hence making possible advantageous implementation in a set equipped with a low load mode (such as a pulse skip function or a function of switching to PFM) as well.

According to the switching regulator of the second embodiment, there is no need to prevent the transistor 1a and the transistor 1c from being switched ON simultaneously, and a certain extent of variability in the timing at which the transistor 1a and the transistor 1c are switched ON and OFF poses no problems at all in their operation, making it possible for the drive control circuit 204 to have a simpler circuit design.

(Third Embodiment)

In the conventional switching regulator depicted in FIG. 11, fluctuation in the output voltage Vout is initially detected by the error amplifier 205 when the load fluctuates, and the duty of the pulse width modulation signal PWM is expanded in association with the rise of the error voltage Verr so that the output voltage Vout is maintained at the target value.

With the above-described conventional configuration, fluctuations in the output voltage Vout can indeed be kept to a minimum when the load has relatively moderate fluctuations.

However, with the above-described conventional configuration, output feedback control by the PWM method is performed after fluctuation in the output voltage Vout is detected by the error amplifier 205. Therefore, the load response speed is low, and the problem of large fluctuations in the output voltage Vout during sudden changes in load sometimes occurs. Increasing the load response speed requires increasing the operating frequency of output feedback control, but the tradeoff for doing so is the problem that conversion efficiency may be adversely affected.

Switching regulators for performing output feedback control by the PFM (Pulse Frequency Modulation) method (comparator method) have high load response speeds, but experience various problems, namely: (1) ripple voltage is high in the steady state; (2) expensive OS capacitors or the like must be used as output capacitors; and (3) EMI (Electro-Magnetic Interference) countermeasures are difficult to implement because the operating frequency of output feedback control fluctuates with load.

The technical feature of the third embodiment is directed to addressing the above problems, and has as an object thereof to provide a switching regulator having both a high load response speed and low ripple characteristics in the steady state.

Figure 6:
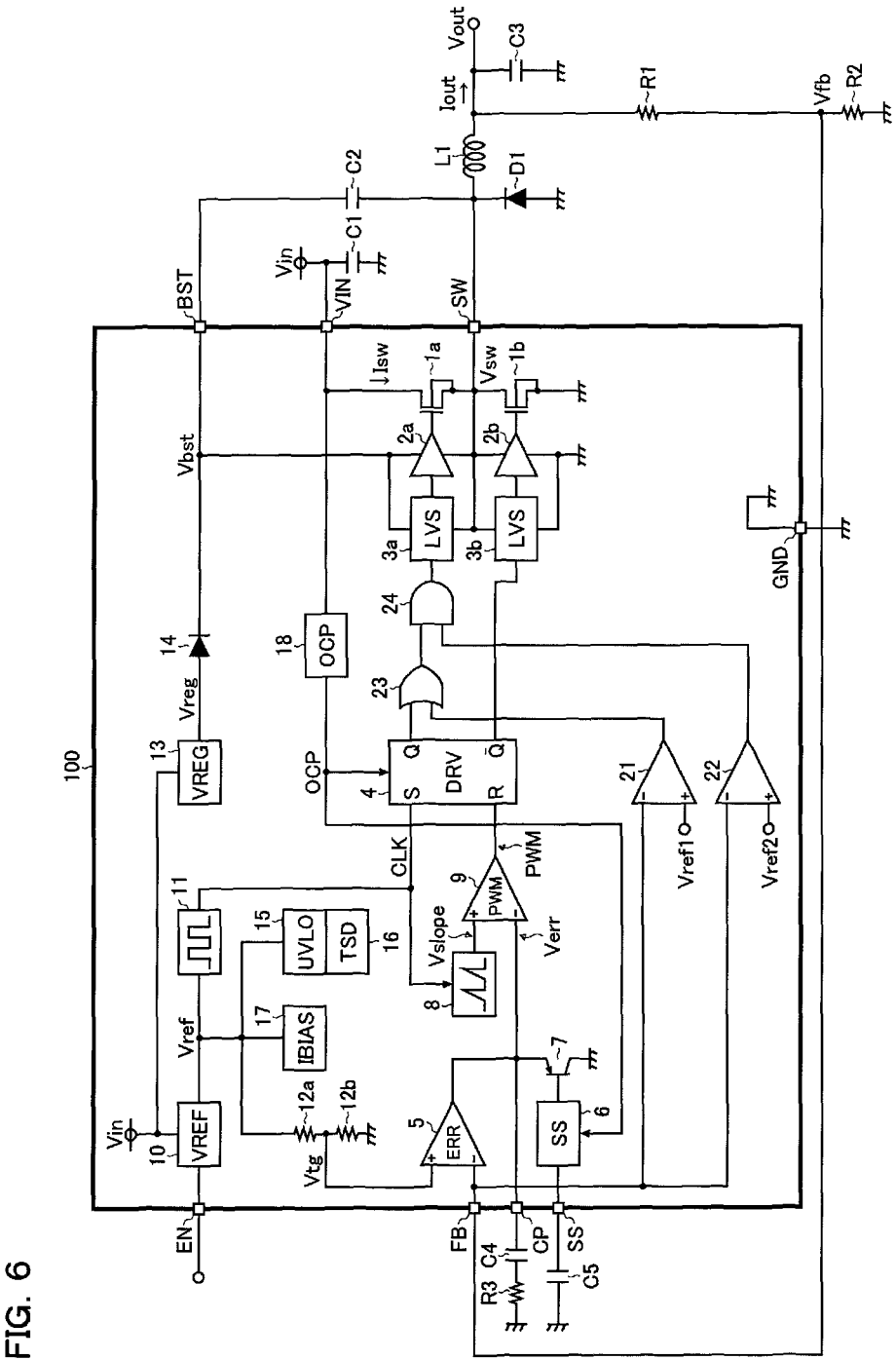
FIG. 6 is a block diagram depicting a third embodiment of the switching regulator.

FIG. 6 is a block diagram depicting a third embodiment of the switching regulator. Elements comparable to those in the first embodiment described previously are assigned the same symbols as in FIG. 1 and are not described where to do so would be redundant, so that the following description may focus on constituent elements unique to the third embodiment.

In the switching regulator of the third embodiment, the switching power supply IC 100 is additionally provided with an ON comparator 21, an OFF comparator 22, a logical addition operator 23, and a logical multiplication operator 24.

The ON comparator 21 and the OFF comparator 22 are each connected at their inverting input end (−) to the feedback terminal FB. The noninverting input end (+) of the ON comparator 21 is connected to the end impressed with a first reference voltage Vref1 (corresponding to the lower-limit setting of the output voltage Vout). The noninverting input end (+) of the OFF comparator 22 is connected to the end impressed with a second reference voltage Vref2 (corresponding to the upper-limit setting of the output voltage Vout). The target voltage Vtg, the first reference voltage Vref1, and the second reference voltage Vref2 have the relationship Vref1<Vtg<Vref2.

The first input end of the logical addition operator 23 is connected to the output end (Q) of the drive control circuit 4. The second input end of the logical addition operator 23 is connected to the output end of the ON comparator 21. The first input end of the logical multiplication operator 24 is connected to the output end of the logical addition operator 23. The second input end of the logical multiplication operator 24 is connected to the output end of the OFF comparator 22. The output end of the logical multiplication operator 24 is connected to the input end of the level shifter 3a.

In the switching regulator having the above-described configuration, when the output voltage Vout drops sharply due to a sudden change in load, and the feedback voltage Vfb decreases below the first reference voltage Vref1, the output signal of the ON comparator 21 rises from a low level to a high level, and the output signal of the logical addition operator 23 is fixed at a high level irrespective of the switching control signal output from the drive control circuit 4. It is apparent that because the feedback voltage Vfb is below the second reference voltage Vref2 as well at this time, the output signal of the OFF comparator 22 must rise to a high level. Accordingly, the gate voltage input to the transistor 1a reaches a high level, and the transistor 1a is forcibly switched ON. As a result, the output voltage Vout switches to an increase without delay, and the output voltage Vout never decreases appreciably below the lower-limit setting thereof.

When, on the other hand, the output voltage Vout in the switching regulator having the above-described configuration rises sharply due to a sudden change in load, and the feedback voltage Vfb rises above the second reference voltage Vref2, the output signal of the OFF comparator 22 falls from a high level to a low level, and the output signal of the logical multiplication operator 24 is fixed at a low level irrespective of the output signal of the logical addition operator 23. Accordingly, the gate voltage input to the transistor 1a reaches a low level, and the transistor 1a is forcibly switched OFF. As a result, the output voltage Vout switches to a decrease without delay, and the output voltage Vout never rises appreciably above the upper-limit setting thereof.

In the switching regulator having the above-described configuration, the output signal of the ON comparator 21 is at a low level, and the output signal of the OFF comparator 22 is at a high level as long as the load does not change suddenly and the feedback voltage Vfb is kept in a voltage range above the first reference voltage Vref1 and below the second reference voltage Vref2. As a result, the output signals of the logical addition operator 23 and the logical multiplication operator 24 both match the output signal of the drive control circuit 4, and the transistor 1a therefore undergoes PWM switching control in response to switching control signals output by the drive control circuit 4, and the output voltage Vout is maintained a the target setting thereof.

Specifically, in the switching regulator of the third embodiment, when the feedback voltage Vfb remains in a voltage range above the first reference voltage Vref1 and below the second reference voltage Vref2, PWM switching control takes place in the same manner as originally; but when the feedback voltage Vfb does not stay within the aforementioned voltage range, switching control takes place according to the PFM method (comparator method) using the ON comparator 21 and the OFF comparator 22.

With such a configuration, the advantages of the PFM method may be enjoyed while retaining the advantages of the PWM method. It is therefore possible to simultaneously attain both high load response speed and low ripple characteristics in the steady state.

FIG. 7 is a table illustrating the advantages of the combined use of PWM and PFM. As shown in FIG. 7, by using a combined PWM/PFM method in the switching regulator of the third embodiment, various advantages can be enjoyed, namely: (1) low ripple voltage can be maintained in the steady state; (2) inexpensive ceramic capacitors can be used as output capacitors; (3) the operation frequency of output feedback control can be kept constant regardless of the load, making EMI countermeasures easy to implement; and (4) the load response speed can be kept high.

(Fourth Embodiment)

As stated previously, in the conventional switching regulator depicted in FIG. 11, fluctuations of the output voltage Vout during load fluctuations are initially detected by the error amplifier 205, and the duty of the pulse width modulation signal PWM is expanded in association with the rise of the error voltage Yen, whereby the output voltage Vout is maintained at the target value. The resistor R3 and capacitor C4 used for phase compensation are connected to the output end of the error amplifier 205, and the load response speed is limited to the output band of the error amplifier 205.

With the above-described conventional configuration as well, fluctuations in the output voltage Vout can indeed be kept to a minimum as long as load fluctuations are relatively moderate.

However, with the above-described conventional configuration, output feedback control according to the PWM method takes place after fluctuation in the output voltage Vout is detected by the error amplifier 205. Therefore, the load response speed is low, and the problem of large fluctuations in the output voltage Vout during sudden changes in load sometimes occurs. Increasing the load response speed requires increasing the operating frequency of output feedback control, but the tradeoff for doing so is the problem that conversion efficiency may be adversely affected. Moreover, with the above-described conventional configuration, due to the tradeoff between improved load response speed and improved stability of output feedback control, there was an inherent limit as to the extent to which the output band of the error amplifier 205 could be increased to improve the load response speed while maintaining stability of output feedback control.

The technical feature of the fourth embodiment is directed to addressing the above problems, and has as an object thereof to provide a switching regulator having both improved load response speed and improved stability of output feedback control.

Figure 8:
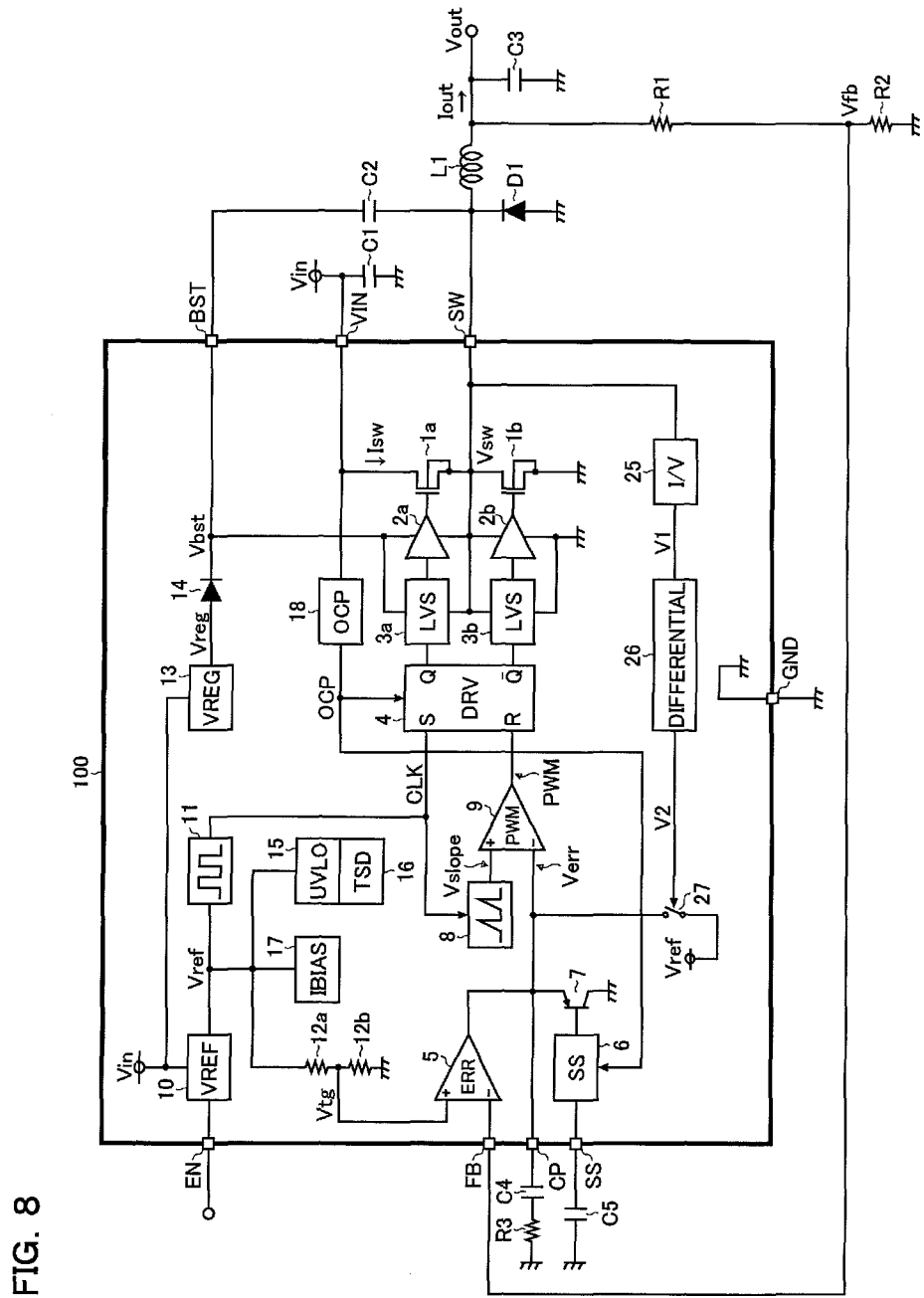
FIG. 8 is a block diagram depicting a fourth embodiment of the switching regulator.

FIG. 8 is a block diagram depicting a fourth embodiment of the switching regulator. Elements comparable to those in the first embodiment described previously are assigned the same symbols as in FIG. 1 and are not described where to do so would be redundant, so that the following description may focus on constituent elements unique to the fourth embodiment.

In the switching regulator of the fourth embodiment, the switching power supply IC 100 further has a current/voltage conversion circuit 25, a differentiating circuit 26, and a switch 27.

The current/voltage conversion circuit 25 converts the switching current Isw in the switch terminal SW to a voltage signal V1. The circuit configuration of the current/voltage conversion circuit 25 is described in detail later.

The differentiating circuit 26 has a resistor, a capacitor, and an operational amplifier, and generates a differentiated voltage signal V2 that corresponds to the voltage signal V1. The differentiated voltage signal V2 is used as an ON/OFF control signal for the switch 27.

The switch 27 is connected between the output end of the error amplifier 5 and the end impressed with the reference voltage Vref, and is subject to ON/OFF control according to the differentiated voltage signal V2.

Figure 9:
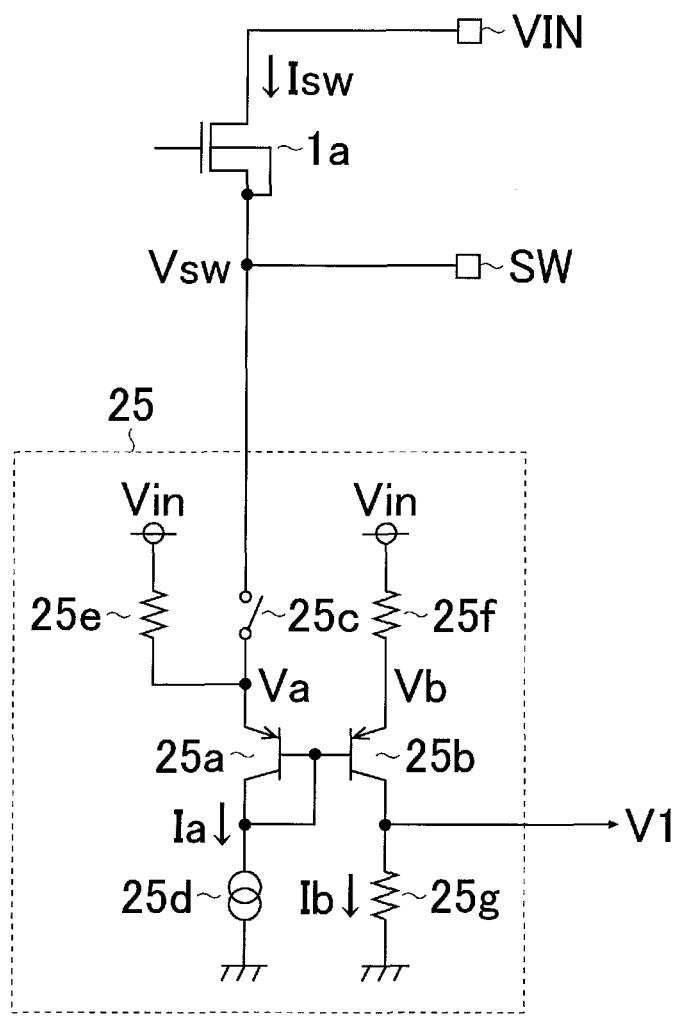
FIG. 9 is a circuit diagram depicting a configurational example of a current/voltage conversion circuit 25.

FIG. 9 is a circuit diagram depicting a configurational example of the current/voltage conversion circuit 25. The current/voltage conversion circuit 25 of this configurational example has pnp bipolar transistors 25a, 25b, a switch 25c, a constant current source 25d, and resistors 25e to 25g.

The emitter of the transistor 25a is connected to the switch terminal SW via the switch 25c, and is connected to the end impressed with the input voltage Vin (the input terminal VIN) via the resistor 25e. The emitter of the transistor 25b is connected to the end impressed with the input voltage Vin (the input terminal VIN) via the resistor 25f (resistance value: Rf). The bases of the transistors 25a and 25b are each connected to the collector of the transistor 25a. The collector of the transistor 25a is connected to the ground terminal GND via the constant current source 25d. The collector of the transistor 25b is connected as the output end of the voltage signal V1 to the input end of the differentiating circuit 26 (see FIG. 8), and is also connected to the ground terminal GND via the resistor 25g (resistance value: Rg).

Figure 10:
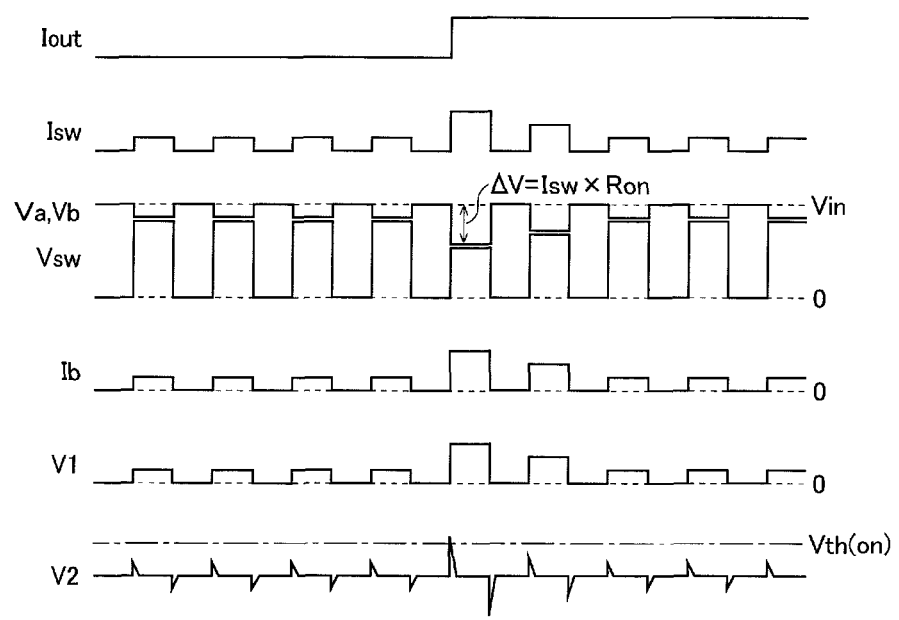
FIG. 10 is a timing chart illustrating the pull-up operation of the error voltage Yen.

FIG. 10 is a timing chart illustrating the pull-up operation of the error voltage Verr, and depicts, in order from the top, the output current Iout, the switching current Isw, the emitter voltage Va of the transistor 25a, the emitter voltage Vb of the transistor 25b, the switching voltage Vsw, the collector current 1b of the transistor 25b, the voltage signal V1, and the differentiated voltage signal V2.

In the current/voltage conversion circuit 25 of FIG. 9, the switch 25c is switched ON when the transistor 1a is ON, and is switched OFF when the transistor is OFF. Accordingly, when the transistor 1a is ON, the emitter voltage Va of the transistor 25a matches the switching voltage Vsw, and when the transistor 1a is OFF, the emitter voltage is equal to the input voltage Vin.

Here, the switching voltage Vsw obtained when the transistor 1a is ON (i.e., the emitter voltage Va of the transistor 25a) is a voltage value equal to the input voltage Vin minus the product $\Delta V$ (equal to Isw×Ron) of the switching current Isw flowing through the transistor 1a and the ON resistance Ron of the transistor 1a (equal to Vin−$\Delta V$=Vin−(equal to Isw×Ron)), and this voltage value declines with increasing switching current Isw when the ON resistance Ron of the transistor 1a is considered constant.

The collector current 1a of the transistor 25a is maintained at a prescribed value by the constant current source 25d. An emitter voltage Vb equal to the emitter voltage Va of the transistor 25a is produced by the emitter of the transistor 25b is therefore generated in association with fluctuations in the emitter voltage Va of the transistor 25a.

As a result, the collector current 1b of the transistor 25b is a current value determined by the emitter voltage Vb of the transistor 25b and the resistance Rf of the resistor 25f (equal to (Vin−Vb)/Rf=(Vin−Va)/Rf).

Specifically, when the transistor 1a is OFF (Va=Vin), the collector current 1b of the transistor 25b is zero, and when the transistor 1a is ON (Va=Vin−(equal to Isw×Ron)), the current is a current value dependent on the switching current Isw (equal to Isw×Ron/Rf).

The voltage signal V1 drawn from the collector of the transistor 25b is a voltage value determined by the collector current Ib of the transistor 25b and the resistance Rg of the resistor 25g (equal to Ib×Rg={(Vin−Va)/Rf}×Rg).

Specifically, when the transistor 1a is OFF (Va=Vin), the voltage signal V1 is zero, and when the transistor 1a is ON (Va=Vin−(equal to Isw×Ron)), the signal is a current value dependent on the switching current Isw (equal to (Isw×Ron/Rf)×Rg).

In a configuration in which the ON resistance of the transistor 1a is used as a means for detecting the switching current Isw, the switching voltage Vsw (equal to Vin−(equal to Isw×Ron)) obtained in the ON-period of the transistor 1a is monitored, and a voltage signal V1 that corresponds to the switching current Isw is generated, there is no need to insert a separate sense resistor as a means for detecting the switching current Isw into the current path over which the switching current Isw flows, making it possible to achieve lower costs and improved output efficiency.

The differentiated voltage signal V2 obtained by differentiating the aforementioned voltage signal V1 generates a differentiated waveform that corresponds to the voltage value of the voltage signal V1 with every rising or falling edge of the voltage signal V1.

Absent any sudden change in load, the current value of the switching current Isw is small and the voltage value of the voltage signal V1 is low. Therefore, the voltage value of the differentiated voltage signal V2 does not reach the ON threshold voltage Vth(on) of the switch 27, and the switch 27 is maintained in the OFF state. Accordingly, the output end of the error amplifier 5 is not pulled up to the end impressed with the reference voltage Vref, and output feedback control takes place in the normal manner according to the feedback voltage Vfb.

On the other hand, when the switching voltage Isw increases sharply due to a sudden change in load, causing the voltage value of the voltage signal V1 to rise sharply, the voltage value of the differentiated voltage signal V2 will exceed the ON threshold voltage Vth(on) of the switch 27, and the switch 27 will transition to the ON state. As a result, the output end of the error amplifier 5 is pulled up to the end impressed with the reference voltage Vref, and the error voltage Verr is increased on purpose without waiting for output feedback control according to the feedback voltage Vfb.

Specifically, the switching regulator of the fourth embodiment has a supplementary feedback path used for fast response (current/voltage conversion circuit 25, differentiating circuit 26, and switch 27) in addition to an output feedback path routed through the error amplifier 5, and is configured so that the supplementary feedback path used for fast response is used only at times of a sudden change in load to augment the operating speed of the error amplifier 5.

Adopting such a configuration makes it possible to dispense with the need to unnecessarily increase the operating frequency in the output feedback path routed through the error amplifier 5, making it possible to increase the load response speed to a sufficient extent without adversely affecting conversion efficiency or destabilizing output feedback control.

A configuration in which an output current Tout or a output voltage Vout is detected and a differentiated voltage signal V2 is generated can be suggested in addition to a configuration in which a switching voltage Isw is detected and a differentiated voltage signal V2 is generated as a supplementary feedback path used for fast response.

(Other Modified Examples)

Apart from the embodiments set forth herein, various modifications of the invention are possible without departing from the scope and spirit of the invention. Specifically, the preceding embodiments are in all respects merely exemplary and should not be construed as limiting, and the technical scope of the invention should not be understood on the basis of the preceding description of the embodiments but rather on the basis of the appended claims to include equivalents of the claims and any modifications falling within the scope thereof.

For example, the n-channel MOS field effect transistor may be optionally replaced with an npn bipolar transistor, or the p-channel MOS field effect transistor may be optionally replaced with a pnp bipolar transistor. Where such replacements are made, connections would be made so that the gate, drain, and source of the MOS field effect transistor correspond to the base, collector, and emitter of the bipolar transistor.

In addition to providing the switching power supply IC 100 with the overvoltage protection circuit 19 described above with reference to FIG. 3, it is useful to provide the switching power supply IC 100 (more specifically, the error amplifier 5, the slope voltage generation circuit 8, the PWM comparator 9, the drive control circuit 4, the level shifters 3a and 3b, and the drivers 2a and 2b) with a shutdown circuit 28 adapted to forcibly stop the operation in the event that the overvoltage protection operation repeats continuously for a prescribed time period.

Figure 13:
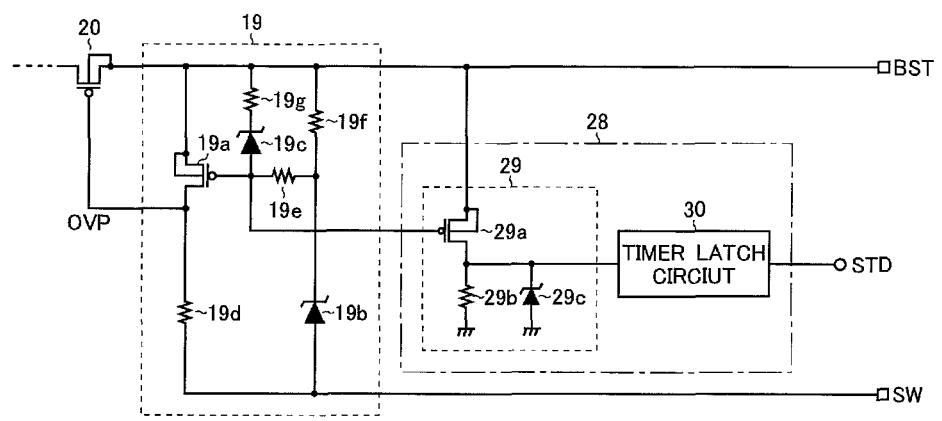
FIG. 13 is a circuit diagram depicting a configurational example of a shutdown circuit 28.

FIG. 13 is a circuit diagram depicting a configurational example of the shutdown circuit 28. The shutdown circuit 28 of the present configurational example includes a level shift circuit 29 and a timer latch circuit 30.

The level shift circuit 29 includes a p-channel MOS field effect transistor 29a, a resistor 29b, and a Zener diode 29c. The source and back gate of the transistor 29a are connected to the bootstrap terminal BST. The drain of the transistor 29a is connected to each of the first end of the resistor 29b, the cathode of the Zener diode 29c, and the input end of the timer latch circuit 30. The gate of the transistor 29a is connected to the gate of the transistor 19a. The second end of the resistor 29b and the anode of the Zener diode 29c are both connected to the ground end.

In the level shift circuit 29 having the above-described configuration, the transistor 29a exhibits ON/OFF behavior analogous to the transistor 19a included in the overvoltage protection circuit 19. Specifically, when the inter-terminal voltage Vy impressed across the bootstrap terminal BST and the switch terminal SW is in the normal condition, the transistor 29a enters the OFF state, and the output signal to the timer latch circuit 30 assumes a low level. On the other hand, when the inter-terminal voltage Vy reaches an overvoltage condition, the transistor 29a enters the ON state, and the output signal to the timer latch circuit 30 reaches a high level. However, the corresponding high-level electric potential at this time is clamped to a prescribed value (e.g., 5 V) by the Zener diode 29c.

The timer latch circuit 30 monitors the input signal from the level shift circuit 29 and sets a shutdown signal STD to an abnormal-condition logic level (e.g., high level) to forcibly stop the operation of the switching power supply IC 100 when the logic level of the signal intermittently cycles between a high level and a low level for a prescribed time period, specifically, when a negative cycle is established and repeated overvoltage protection operations take place continuously over a prescribed time period so that the inter-terminal voltage Vy first assumes an overvoltage state and is then returned to the normal state by an overvoltage protection operation, but subsequently reverts to the overvoltage state because the cause of the overvoltage remains fundamentally unresolved.

With a configuration having a shutdown circuit 28, it is possible to detect and forcibly stop the operation of the switching power supply IC 100 when a conditions occurs in which the inter-terminal voltage impressed across the bootstrap terminal BST and the switch terminal SW alternates between the normal condition, and the transistor 19a is repeatedly switched ON and OFF, and this condition continues for a prescribed time period.

The above description was given with reference to configurations in which the first to fourth embodiments were adopted separately, but these embodiments may be also implemented in an overlapping manner.

(Industrial Applicability)

The present invention provides a technique useful for improving the performance of switching regulators, which enjoy widespread use as power supply units for liquid crystal displays, plasma displays, PC power supplies (DDR (Double-Data-Rate) memory power supplies, etc.), or for DVD (Digital Versatile Disk) player/recorders, for example.

LIST OF REFERENCE NUMERALS

100 Switching power supply IC
1a N-channel MOS field effect transistor (for output)
1b N-channel MOS field effect transistor (for ringing noise discharge)
1c P-channel MOS field effect transistor (for low load)
2a, 2b Driver
3a, 3b Level shifter
4 Drive control circuit
5 Error amplifier
6 Soft start control circuit
6a Resistor (for charging C5)
6b N-channel MOS field effect transistor (for discharging C5)
7 Pnp bipolar transistor
8 Slope voltage generation circuit
9 PWM comparator
10 Reference voltage generation circuit
11 Oscillator
12a, 12b Resistor
13 Boosting constant voltage generation circuit
14 Diode
15 Undervoltage lockout circuit
16 Thermal shutdown circuit
17 Input bias current generation circuit
18 Overcurrent protection circuit
19 Overvoltage protection circuit
19a P-channel MOS field effect transistor
19b, 19c Zener diode
19d-19g Resistor
20 P-channel MOS field effect transistor
21 ON comparator
22 OFF comparator
23 Logical addition operator
24 Logical multiplication operator
25 Current/voltage conversion circuit
25a, 25b Pnp bipolar transistor
25c Switch
25d Constant current source
25e-25g Resistor
26 Differentiating circuit
27 Switch
28 Shutdown circuit
29 Level shift circuit
29a P-channel MOS field effect transistor
29b Resistor
29c Zener diode
30 Timer latch circuit
L1 Inductor
D1 Diode
R1-R3 Resistor
C1-C5 Capacitor
EN Enable terminal
FB Feedback terminal
CP Phase compensation terminal
SS Soft start terminal
BST Bootstrap terminal
VIN Input terminal
SW Switch terminal
GND Ground terminal

What is claimed is:

1. A semiconductor device, comprising:
an n-channel or npn-type output transistor wherein an input voltage is impressed on a drain or a collector, and a pulsed switching voltage that corresponds to a switching drive of the transistor is brought out from a source or an emitter;
a bootstrap circuit for generating a boost voltage enhanced by a predetermined electric potential above the switching voltage;
an internal circuit for receiving a supply of the boost voltage to generate a switching drive signal, and supplying the signal to a gate or base of the output transistor;
an overvoltage protection circuit for monitoring an electric potential difference between the switching voltage and the boost voltage, and generating an overvoltage detection signal; and
a switching element for establishing/blocking electrical conduction between the internal circuit and the end impressed with the boost voltage, in accordance with the overvoltage detection signal.

2. The semiconductor device of claim 1, wherein the switching element is a high-withstand-voltage element that does not break down upon generation of an electric potential difference that corresponds to twice the input voltage between the switching voltage and the boost voltage.

3. The semiconductor device of claim 1, wherein the bootstrap circuit has a diode whose anode is connected to the end impressed with the constant voltage, and whose cathode is connected to the end impressed with the boost voltage via the switching element.

4. The semiconductor device of claim 1, wherein the overvoltage protection circuit has the following components:
a p-channel or pnp-type transistor whose source or emitter is connected to the end impressed with the boost voltage, and whose drain or collector is connected to an on/off control terminal of the switching element;
a first Zener diode whose anode is connected to the end impressed with the switching voltage;
a first resistor connected between the on/off control terminal of the switching element and the end impressed with the switching voltage;
a second resistor connected between a gate or base of the transistor and a cathode of the first Zener diode; and
a third resistor connected between a cathode of the first Zener diode and the end impressed with the boost voltage.

5. The semiconductor device of claim 4, wherein the overvoltage protection circuit further has the following components:
- a second Zener diode whose anode is connected to a gate or base of the transistor; and
- a fourth resistor connected between a cathode of the second Zener diode and a terminal impressed with the boost voltage.

6. The semiconductor device of claim 1, comprising:
- a synchronous rectification transistor connected between the end impressed with the switching voltage and the end impressed with the ground voltage, the transistor being switchably driven in complementary fashion to the output transistor.

7. The semiconductor device of claim 1, comprising:
- a shutdown circuit for forcibly stopping an operation of the semiconductor device when an overvoltage protection operation by the overvoltage protection circuit has repeatedly continued over a prescribed time period.

8. The semiconductor device of claim 7, wherein the shutdown circuit has the following components:
- a level shift circuit for monitoring an electric potential difference between the switching voltage and the boost voltage; and
- a timer latch circuit for monitoring an input signal from the level shift circuit and setting a shutdown signal to an abnormal logic level to forcibly stop an operation of the semiconductor device when the logic level of the input signal intermittently cycles between a high level and a low level over a prescribed time period.

9. The semiconductor device of claim 1, wherein the internal circuit is a level shifter and driver for generating the switching drive signal on the basis of a predetermined switching control signal.

10. The semiconductor device of claim 1, comprising the following components:
- an error amplifier for amplifying a differential between a predetermined target voltage and a feedback voltage that corresponds to an output voltage obtained by rectifying and smoothing the switching voltage, and for generating an error voltage;
- an oscillator for generating a clock signal having a predetermined frequency;
- a slope voltage generation circuit for generating a slope voltage having a triangular, ramp, or sawtooth waveform on the basis of the clock signal;
- a PWM comparator for comparing the error voltage and the slope voltage and generating a pulse width modification signal; and
- a drive control circuit for generating the switching control signal on the basis of the clock signal and the pulse width modification signal.

11. A switching regulator, comprising:
- a semiconductor device;
- a rectifying/smoothing circuit for rectifying/smoothing a pulsed switching voltage generated by the semiconductor device, and generating a desired output voltage;
- a feedback voltage generation circuit for generating a feedback voltage that corresponds to the output voltage; and
- a capacitor connected between the end impressed with the switching voltage and the end impressed with the boost voltage, the capacitor forming a bootstrap circuit;
- wherein the semiconductor device has the following components:
- an n-channel or npn-type output transistor wherein an input voltage is impressed on a drain or a collector, and a pulsed form of the switching voltage that corresponds to a switching drive of the transistor is brought out from a source or an emitter;
- a bootstrap circuit for generating a boost voltage enhanced by a predetermined electric potential above the switching voltage;
- an internal circuit for receiving a supply of the boost voltage to generate a switching drive signal, and supplying the signal to a gate or base of the output transistor;
- an overvoltage protection circuit for monitoring an electric potential difference between the switching voltage and the boost voltage, and generating an overvoltage detection signal; and
- a switching element for establishing/blocking electrical conduction between the internal circuit and the end impressed with the boost voltage, in accordance with the overvoltage detection signal.

12. The switching regulator of claim 11, wherein the switching element is a high-withstand-voltage element that does not break down upon generation of an electric potential difference that corresponds to twice the input voltage between the switching voltage and the boost voltage.

13. The switching regulator of claim 11, wherein the bootstrap circuit has a diode whose anode is connected the end impressed with the constant voltage, and whose cathode is connected to the end impressed with the boost voltage via the switching element.

14. The switching regulator of claim 11, wherein the overvoltage protection circuit has the following components:
- a p-channel or pnp-type transistor whose source or emitter is connected to a terminal impressed with the boost voltage, and whose drain or collector is connected to an on/off control terminal of the switching element;
- a first Zener diode whose anode is connected to the end impressed with the switching voltage;
- a first resistor connected between the on/off control terminal of the switching element and the end impressed with the switching voltage;
- a second resistor connected between a gate or base of the transistor and a cathode of the first Zener diode; and
- a third resistor connected between a cathode of the first Zener diode and the end impressed with the boost voltage.

15. The switching regulator of claim 14, wherein the overvoltage protection circuit further has the following components:
- a second Zener diode whose anode is connected to a gate or base of the transistor; and
- a fourth resistor connected between a cathode of the second Zener diode and the end impressed with the boost voltage.

16. The switching regulator of claim 11, wherein the semiconductor device has the following components:
- a synchronous rectification transistor connected between the end impressed with the switching voltage and the end impressed with the ground voltage, the transistor being switchably driven in complementary fashion to the output transistor.

17. The switching regulator of claim 11, wherein the semiconductor device has the following components:
- a shutdown circuit for forcibly stopping an operation of the semiconductor device when an overvoltage protection operation by the overvoltage protection circuit has repeatedly continued over a prescribed time period.

18. The switching regulator of claim 17, wherein the shutdown circuit has the following components:

a level shift circuit for monitoring an electric potential difference between the switching voltage and the boost voltage; and a timer latch circuit for monitoring an input signal from the level shift circuit and setting a shutdown signal to an abnormal logic level to forcibly stop an operation of the semiconductor device when the logic level of the input signal intermittently cycles between a high level and a low level over a prescribed time period.

19. The switching regulator of claim 11, wherein the internal circuit is a level shifter and driver for generating the switching drive signal on the basis of a predetermined switching control signal.

20. The switching regulator of claim 11, wherein the semiconductor device has the following components:

an error amplifier for amplifying a differential between a predetermined target voltage and a feedback voltage that corresponds to an output voltage obtained by rectifying and smoothing the switching voltage, and for generating an error voltage;

an oscillator for generating a clock signal having a predetermined frequency;

a slope voltage generation circuit for generating a slope voltage having a triangular, ramp, or sawtooth waveform on the basis of the clock signal;

a PWM comparator for comparing the error voltage and the slope voltage and generating a pulse width modification signal; and a drive control circuit for generating the switching control signal on the basis of the clock signal and the pulse width modification signal.

* * * * *